(12) United States Patent
Barbot et al.

(10) Patent No.: US 11,552,592 B2
(45) Date of Patent: Jan. 10, 2023

(54) MANUFACTURING A CONCENTRATING SUB-MODULE COMPRISING A HEAT-DISSIPATING MATERIAL

(71) Applicant: COMMISSARIAT A L'ENERGIE ATOMIQUE ET AUX ENERGIES ALTERNATIVES, Paris (FR)

(72) Inventors: Anthony Barbot, Chambery (FR); Yannick Roujol, Saint-Chef (FR); Caroline Seraine, Sainte-Helene-du-Lac (FR); Clément Weick, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/770,576

(22) PCT Filed: Nov. 29, 2018

(86) PCT No.: PCT/EP2018/082965
§ 371 (c)(1),
(2) Date: Jun. 5, 2020

(87) PCT Pub. No.: WO2019/110408
PCT Pub. Date: Jun. 13, 2019

(65) Prior Publication Data
US 2021/0013831 A1     Jan. 14, 2021

(30) Foreign Application Priority Data

Dec. 7, 2017  (FR) ...................... 1761781

(51) Int. Cl.
*H02S 40/22*  (2014.01)
*H02S 40/30*  (2014.01)
(Continued)

(52) U.S. Cl.
CPC ............ *H02S 40/22* (2014.12); *H01L 31/048* (2013.01); *H01L 31/05* (2013.01); *H02S 40/30* (2014.12); *H02S 30/10* (2014.12)

(58) Field of Classification Search
CPC .. H01L 31/054; H01L 31/048; H01L 31/0547
See application file for complete search history.

(56) References Cited

U.S. PATENT DOCUMENTS

| 5,180,441 A | 1/1993 | Cornwall et al. |
| 5,344,496 A | 9/1994 | Stern et al. |
| (Continued) |

FOREIGN PATENT DOCUMENTS

| EP | 1715 260 A2 | 10/2006 | |
| EP | 2122269 B1 * | 4/2010 | ............. F24J 2/1057 |
| (Continued) |

OTHER PUBLICATIONS

Definition of "bonding" retrieved from https://www.merriam-webster.com/dictionary/bonding on Nov. 3, 2021.*

(Continued)

*Primary Examiner* — Christina Chern
(74) *Attorney, Agent, or Firm* — BakerHostetler

(57) ABSTRACT

A method for manufacturing a concentrating photovoltaic solar sub-module equipped with a reflective face having a concave predefined geometric shape, wherein it includes laminating, in a single step, a multi-layer assembly comprising in succession: a structural element equipped with a reflective first face and a second face, opposite the first; a layer of a material of good thermal conductivity, higher than that of the material from which the structural element is composed, the layer being placed on the second face of the structural element; a layer of encapsulant or of adhesive; a photovoltaic receiver, the layer of encapsulant or of adhesive being placed between the layer of a material of good thermal conductivity and the receiver; a layer made of transparent encapsulating material, covering at least the entire surface of the photovoltaic receiver; and a transparent protective layer covering the layer made of transparent encapsulating material; and during the lamination, the reflective face of the (Continued)

structural element is shaped by being brought into contact with a convex surface of a counter-mold, in order to obtain the reflective face of concave predefined geometric shape.

8 Claims, 4 Drawing Sheets

(51) Int. Cl.
*H01L 31/048* (2014.01)
*H01L 31/05* (2014.01)
*H02S 30/10* (2014.01)

(56) References Cited

U.S. PATENT DOCUMENTS

| | | |
|---|---|---|
| 7,875,792 B2 | 1/2011 | Paull |
| 7,906,722 B2 | 3/2011 | Fork et al. |
| 10,044,003 B2 | 8/2018 | Park et al. |
| 2004/0118395 A1 | 6/2004 | Rubbia et al. |
| 2007/0221313 A1 | 9/2007 | Franck et al. |
| 2007/0256726 A1 | 11/2007 | Fork et al. |
| 2008/0291634 A1 * | 11/2008 | Weiser ............... H01L 23/3737 361/708 |
| 2010/0186806 A1 | 7/2010 | Morikawa et al. |
| 2013/0081668 A1 | 4/2013 | Linderman |

FOREIGN PATENT DOCUMENTS

| | | | |
|---|---|---|---|
| JP | 4-116987 A | 4/1992 | |
| JP | 2008-78380 A | 4/2008 | |
| JP | 2016-62931 A | 4/2016 | |
| KR | 2016-0062451 A | 6/2016 | |
| KR | 20160062451 A * | 6/2016 | ......... H01L 31/0543 |
| WO | 2009/002350 A1 | 12/2008 | |
| WO | 2010/017422 A2 | 2/2010 | |
| WO | 2012/044017 A2 | 4/2012 | |
| WO | 2013/049471 A1 | 4/2013 | |

OTHER PUBLICATIONS

Definition of "bond" retrieved from https://www.merriam-webster.com/dictionary/bond on Nov. 3, 2021.*
English machine translation of Lee (KR 20160062451), published Jun. 2, 2016.*
Notice of Rejection issued in Japanese Patent Application No. 2020-531003, dated Oct. 4, 2022, with English translation.

* cited by examiner

MANUFACTURING A CONCENTRATING SUB-MODULE COMPRISING A HEAT-DISSIPATING MATERIAL

CROSS-REFERENCE TO RELATED APPLICATIONS

This application is a National Stage of International patent application PCT/EP2018/082965, filed on Nov. 29, 2018, which claims priority to foreign French patent application No. FR 1761781, filed on Dec. 7, 2017, the disclosures of which are incorporated by reference in their entirety.

FIELD OF THE INVENTION

The invention relates to the manufacture of elements for concentrating photovoltaic modules, and more particularly for concentrating photovoltaic modules based on reflective linear parabolic concentrators (or mirrors). These elements are called concentrating photovoltaic sub-modules.

BACKGROUND

These sub-modules each comprise an optical device for concentrating light (often called a mirror or concentrator) and photovoltaic cells forming a photovoltaic receiver and placed on the back side of the mirror or concentrator, opposite the reflective face.

When they are employed, they allow a concentrating photovoltaic module to be formed, the concentrator of a sub-module having a focal line located on the back of the concentrator of a neighboring sub-module. The photovoltaic receiver of the neighboring sub-module is located level with this focal line. Thus, each mirror plays, in addition to its concentrator role, the role of carrier for a photovoltaic receiver. The concentrating photovoltaic module therefore consists in an assembly of a plurality of generally identical elements, called sub-modules.

The concentrator or mirror of these concentrating solar sub-modules possesses a reflective surface composed of a mirror, and a back side to which one or a set of photovoltaic cells is fastened (see document US 1993/5180441). The parabolic shape of the module allows the light rays to be concentrated. The light striking a first sub-module is reflected by the reflective surface of the first sub-module, so as to concentrate the light onto the photovoltaic cell of a second sub-module located in proximity to the first module.

It is also possible to produce a concentrating photovoltaic sub-module, of parabolic shape (see document US 2007/0256726), in which the light is not concentrated onto the focal point of a mirror, but onto the focal point of a complex solid element composed of a plurality of mirrors. In this document, the photovoltaic cells are placed on the front side of the concentrator. In order to avoid the formation of air bubbles between the various components of the sub-module, a plurality of vacuum laminations are carried out to incorporate the optics, the photovoltaic cells and the cabling. The vacuum lamination thus makes it possible to ensure a better adhesion of the optics, of the cells or of the cabling to their respective carrier using little or no adhesive. As these various laminations form a planar composite structure, there is another manufacturing step, in which mirrors are fastened to convex or concave surfaces, in order to produce the parabolic shape, which serves to concentrate the light onto the focal point of the solid optical element.

Document US 2004/0118395 presents a parabolic solar concentrator comprising a honeycomb structure flanked by two skins. This honeycomb structure allows a lightweight concentrator, capable of supporting thin mirrors or a thin reflective surface and of good mechanical strength, to be obtained. Nevertheless, this element comprises no photovoltaic cell, because it is intended to heat a fluid. In addition, it is manufactured in a plurality of steps, in particular: the reflective surface is deformed cold, the mirrors are fastened with an adhesive to one of the skins, and the surface of the skins and of the mirrors are treated.

The reflective surface may be composed of a layer of a highly reflective metal covered with a protective film, or composed of a metal layer adhesively bonded to a substrate comprising organic composites (see document US 1994/5344496). A mesh of a material of high thermal conductivity may also be added to the back of the reflective surface to improve the dissipation of heat from the sub-module. The manufacture of the sub-modules is quite complex, because it requires many steps, such as forming and polishing the reflective surface, or treating the surface. It is also necessary to provide a step of bonding the photovoltaic cells to the mirror.

The use of composite materials in concentrating solar sub-modules allows light and stiff sub-modules to be obtained, however the thermal conductivity of these materials is lower than that of certain metals, aluminum in particular. However, increasing the temperature of the sub-module has the effect of decreasing the efficiency of the photovoltaic cells and of decreasing the lifetime thereof.

In order to improve the dissipation of heat from planar photovoltaic modules, as for example used on the roofs of buildings, it is possible to use a massive radiator composed of graphite (see document US 2010/0186806) or a graphite sheet (see document WO 2012/044017). The radiator or the graphic sheet are placed on the back of the photovoltaic module, under the photovoltaic cells in order to limit the temperature increase thereof. Nevertheless, these solutions require additional steps during manufacture of the module or do not allow lightweight and rigid concentrating solar modules to be manufactured.

SUMMARY OF THE INVENTION

The invention aims to remedy the aforementioned drawbacks of the prior art; more particularly, it aims to provide a method, comprising only a single step, for manufacturing a concentrating photovoltaic sub-module incorporating a heat-dissipating material.

One subject of the invention is therefore a method for manufacturing a concentrating photovoltaic solar sub-module equipped with a reflective face having a concave predefined geometric shape, characterized in that the method comprises laminating, in a single step, a multi-layer assembly comprising in succession a structural element equipped with a reflective first face and a second face, opposite the first, a layer of a material of good thermal conductivity, higher than that of the material from which the structural element is composed, said layer being placed on the second face of the structural element, a layer of encapsulant or of adhesive, a photovoltaic receiver, the layer of encapsulant or of adhesive being placed between the layer of a material of good thermal conductivity and the receiver, a layer made of transparent encapsulating material, covering at least the entire surface of the photovoltaic receiver, and a transparent protective layer covering the layer made of transparent encapsulating material, and characterized in that, during the lamination, the reflective face of the structural element is shaped by being brought into contact with a convex surface of a counter-mold, in order to obtain the reflective face of concave predefined geometric shape.

According to particular embodiments of the invention:

The concave predefined geometric shape of said reflective face may be parabolic;

The structural element may be made of composite;

The material of good thermal conductivity may be graphite, and more particularly a graphite sheet having a thickness comprised between 50 µm and 500 µm;

The material of good thermal conductivity may be graphene;

The transparent encapsulating material and the transparent protective layer may cover the entire surface of said material of good thermal conductivity, so as to protect it; and The material of good conductivity may cover the entire surface of the second face of the structural element.

Another subject of the invention is a concentrating photovoltaic solar sub-module equipped with a reflective face having a concave predefined geometric shape, comprising a structural element equipped with a reflective first face and with a second face, opposite the first face, the reflective first face forming the reflective face of the sub-module, a layer of a material of good thermal conductivity, placed directly on the second face of the structural element, a layer of encapsulant or of adhesive, a photovoltaic receiver, the layer of encapsulant or of adhesive being placed between the layer of a material of good thermal conductivity and the receiver, a layer made of transparent encapsulating material covering at least the entire surface of the photovoltaic receiver, and a transparent protective layer forming a second face of the sub-module, which face is opposite the reflective face, said layer covering the layer made of transparent encapsulating material.

BRIEF DESCRIPTION OF THE DRAWINGS

Other features, details and advantages of the invention will become apparent upon reading the description provided with reference to the appended drawings, which are given by way of example and which show, respectively.

The elements shown in the figures are not to scale, and the proportions are therefore not representative of reality.

DETAILED DESCRIPTION

The lamination is a step in which pressure is applied to two or more layers of hot material to bond and press them. The pressure and temperature of this step are dependent on the materials employed. The lamination here allows the concentrator to be shaped via application to a counter-mold.

Figure 1A:
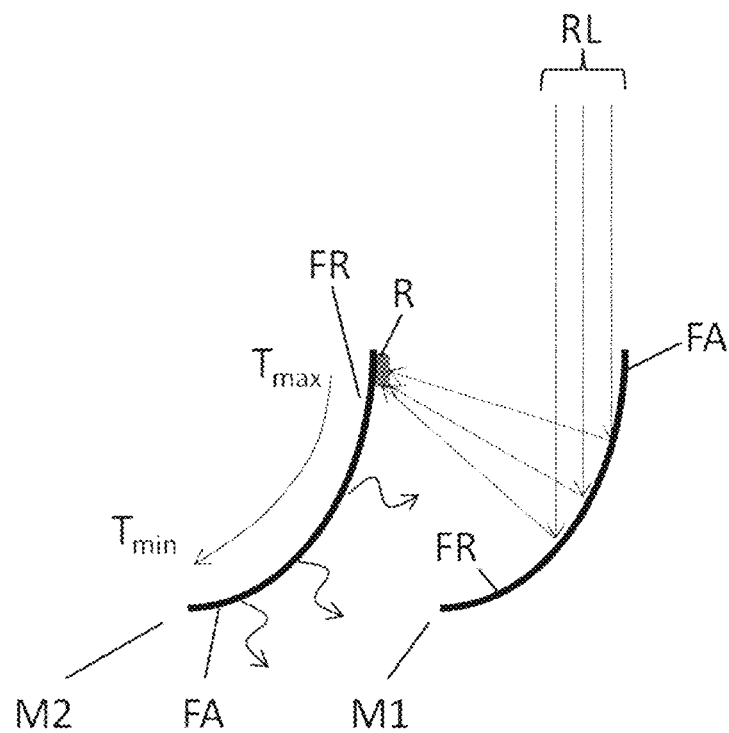
FIG. 1a, a cross section of a module composed of two sub-modules, illustrating the operation of a concentrating photovoltaic module.

FIG. 1a shows a cross section of two concentrating photovoltaic sub-modules, illustrating the operation of a concentrating photovoltaic module. Only two sub-modules M1 and M2 are shown, but the operation described below may be applied to a multitude of sub-modules. Light rays RL strike a reflective first face FR of a first sub-module M1. The reflective face FR conventionally consists of a parabolic cylindrical mirror. The parabolic shape of the mirror of the sub-module M1 makes it possible to make the light rays RL converge on the focal point of the mirror, the position of which is precisely calculated in order to allow a photovoltaic receiver R to be placed there. This position also corresponds to a point on a second face FA of a second sub-module M2. The parabolic mirrors have thermal, structural and optical functions. Specifically, in addition to concentrating the light into a point, they allow heat to be dissipated, with a maximum temperature $T_{max}$ at the receiver R and a minimum temperature $T_{min}$ in the lower portion of the sub-module, the receiver R being positioned in the upper portion. The dissipation of heat is represented by arrows in the figure, and the arrow linking $T_{max}$ to $T_{min}$ represents the temperature gradient along the sub-module (US 1993/5180441). In order to be able to produce a system comprising a plurality of sub-modules, the second face FA of the sub-module M1 may also bear a photovoltaic receiver and the face FR of the sub-module M2 may be reflective.

Figure 1B:
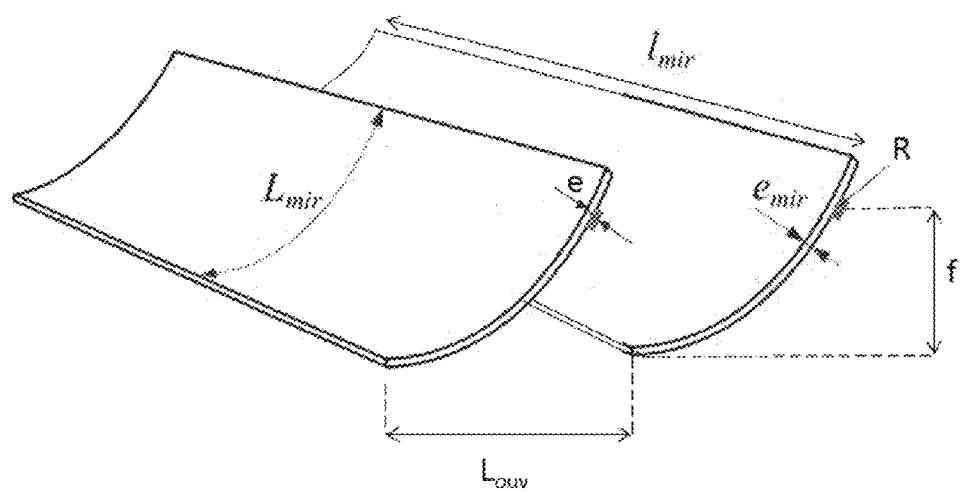
FIG. 1b, the characteristic dimensions of a concentrating photovoltaic module.

FIG. 1b shows the characteristic dimensions of a concentrating photovoltaic module. The shape given to the sub-modules is a segment of parabola of focal length f. The developed width of this segment of parabola is given by $L_{mir}$. The distance between two sub-modules is given by $L_{ouv}$. The length of the sub-modules is given by $l_{mir}$, the thickness of the concentrator by $e_{mir}$ and the thickness of the sub-module by e.

Figure 2:
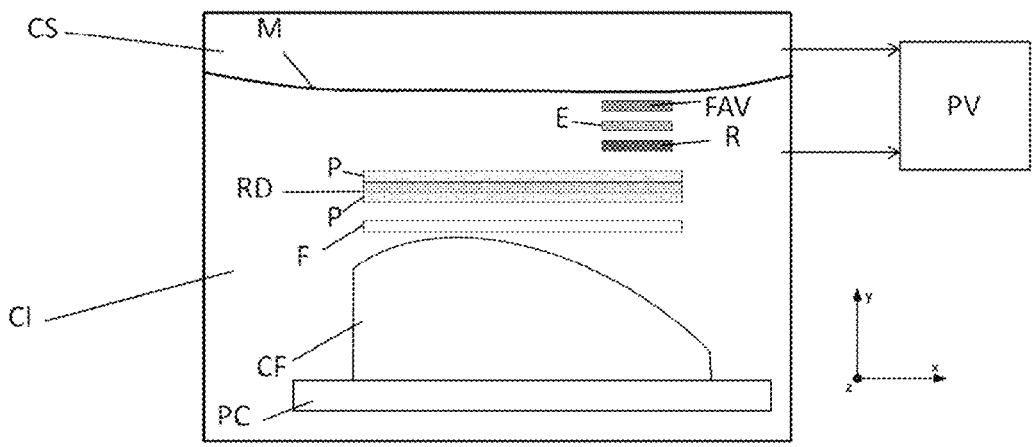
FIG. 2, an illustration of a method for manufacturing a concentrating photovoltaic sub-module.

FIG. 2 shows an illustration of a method for manufacturing a concentrating photovoltaic sub-module. A transparent layer FAV, covering a transparent encapsulant E, itself covering a photovoltaic receiver R, and a structural elements are placed on a counter-mold CF in the lower chamber CI of a laminator, and more particularly of a laminator such as those used in the field of manufacture of planar conventional photovoltaic modules.

The structural element has a reflective face and it in particular comprises a core RD, also referred to as the reinforcement, flanked by two skins P, one of which is covered with a reflective film F.

The transparent layer FAV and the encapsulant E cover at least the entire surface of the receiver R, the receiver R being placed between the structural element and the encapsulant E.

The structural element and the reflective film R have the same area as the desired sub-module.

The lower and upper chambers CI, CS of the laminator are pumped out by virtue of a vacuum pump PV.

The assembly made up of the transparent layer FAV, of the transparent encapsulant E, of the photovoltaic receiver R, of the skins P, of the core RD and of the reflective film F, which is denoted (FAV, E, R, P, RD, P, F), is planar and undergoes a hot lamination, preferably under vacuum, with forming achieved using the counter-mold CF.

The counter-mold CF allows the concave parabolic shape of the reflective face of the sub-module to be defined in the laminating step. It therefore has a surface intended to make direct contact with the reflective face of the structural element in the laminating step. This surface has a predefined geometry corresponding to the shape that it is desired to obtain for the reflective face of the structural element. The counter-mold CF may be made of metal or composite, and is covered with a nonstick layer (made of Teflon for example). The material of the counter-mold CF is chosen so as to be a thermal conductor and to have a high mechanical strength at the lamination temperature.

The temperature and pressure conditions and the length of this laminating step are selected by a person skilled in the art depending on the materials to be laminated. By way of example, the laminating step may last at least 15 minutes, the temperature of the lamination advantageously being comprised between 120° C. and 170° C. and the lamination pressure possibly being about 1000 mbar ($10^5$ Pa).

The thickness of the assembly is preferably smaller than 10 mm in order to keep and ensure an optimal parabolic shape for the assembly. The thickness may also be limited by the useful height of the laminator and of the counter-mold CF. During the lamination, the counter-mold CF and the assembly (FAV, E, R, P, RD, P, F) for example rest on a hot plate PC and a uniform vertical node is gradually applied from above by virtue of the membrane, which perfectly conforms to the shapes. During the lamination, it is necessary to sufficiently cross link the encapsulant E and to correctly bake the various elements from which the module is composed, which elements are located at distances such as to be further from or closer to the hot plate PC. To this end, the hot-lamination program is optimized with respect to temperature, pressure and length depending on the materials used.

The skins P may be made of preimpregnated polymer/fiber material, which allows the adhesion of the reflective film F to the core RD to be obtained. The prepreg has a thickness smaller than 200 μm and the percentage of resin is comprised between 40 and 55%. The polymer is chosen from polyester, epoxy or acrylic, whereas the fiber is chosen from glass, carbon, or aramid.

The core RD of the composite MC may be a honeycomb structure made of aramid of Nomex type, of polypropylene, of polycarbonate or of aluminum.

The core RD may also be a foam made of PET (polyethylene terephthalate), PU (polyurethane), PVC (polyvinyl chloride), PEI (polyetherimide) or PMI (polymethyneimine).

The transparent encapsulant E may have a thickness smaller than 500 μm and be made of a cross-linked elastomer, such as EVA (ethyl vinyl acetate), or made of thermoplastic or made of ionically cross-linked thermoplastic copolymer (IONOMER). In the case of a thermoplastic elastomer, the encapsulant E is more particularly made of polyolefin, of silicone, of thermoplastic PU, of polyvinyl butyral or of functional polyolefin.

The transparent layer FAV may have a thickness smaller than 200 μm and be made of ECTFE (or HALAR, ethylene chlorotrifluoroethylene copolymer), FEP (fluorinated ethylene propylene), PMMA (polymethyl methacrylate), PC (polycarbonate), ETFE (ethylene tetrafluoroethylene), PVDF (polyvinylidene fluoride), PET, thin glass or of CPI (transparent polyimide).

The reflective film F may be a polymer film with an aluminum deposition or with a silver deposition. Ideally, the reflective film F is thick enough that the optional 3D honeycomb reinforcement RD cannot be seen through the reflective surface of the module, in order not to disrupt the concentration of light, while ensuring that the total weight of the sub-module remains low. Advantageously, the film has a thickness comprised between 200 and 250 μm.

The photovoltaic receiver R is composed of photovoltaic cells that are interconnected by wires (wire-bonding) and mounted on an IMS-PCB (insulated metal substrate-printed circuit board) receiver by soldering or adhesive bonding using, for example, a conductive silver adhesive. The cells may also be interconnected by strips, this allowing an IMS-PCB receiver not to be used. The cells may be silicon cells or multi-junction cells made of III-V or II-VI semiconductors or made of a material having a perovskite structure on silicon.

The following is an example of implementation of the manufacture of a photovoltaic sub-module:

The transparent layer FAV is made of HALAR (ECTFE) or of FEP with a thickness of 25 μm and a weight per unit area of 54 g/m$^2$;

The transparent encapsulant E is made of ionomer with a thickness of 50 μm and a weight per unit area of 45 g/m$^2$;

The photovoltaic receiver R consists of triple-junction solar cells of 10 mm width and of 10 mm length and of an IMS-PCB receiver of 75 μm thickness;

The core RD is a honeycomb core made of aluminum of 3 mm thickness and of 78 g/m$^2$ weight per unit area, flanked by two skins P made of carbon/epoxy prepreg of 110 g/m$^2$ weight per unit area;

The reflective film F consists of a reflective film made of PET, of an aluminum-containing deposition and of a protective varnish, the film F having a thickness of 71 μm and a weight per unit area of 105 g/m$^2$.

The assembly is deposited on a counter-mold CF made of aluminum, having a parabolic shape of 28 mm height, in the lower chamber CI of a laminator, of 35 mm useful height. The temperature of the hot plate is 150° C. The lower chamber CI is degassed for 300 seconds: the lower and upper chambers CI, CS are pumped out by virtue of the vacuum pump PV. Next, during a second phase of 600 seconds, a uniform vertical load is gradually applied (using the membrane M) to the top of the counter-mold CF, which is placed on the hot plate PC, at a rate of 1400 mbar/min up to a plateau of 1000 mbar.

The sub-modules have a developed width $L_{mir}$ of 180 mm, a length lmir of 1 m and a cell width of 10 mm. Their focal length f is 75 mm and the distance between two sub-modules is Louv=150 mm.

The structural element may comprise a mirror made of aluminum having a thickness smaller than 0.5 mm. The assembly consisting of the transparent layer FAV, of the encapsulant E, of the photovoltaic receiver R and of the aluminum mirror is laminated in a single step on a counter-mold CF in the same way as above. In this case, the total weight of the sub-module is slightly greater (30%). Its mechanical strength is lower and it will therefore require additional supports: specifically three supports are necessary for a sub-module of 1 m length whereas two supports are necessary for a sub-module of same size made of composite. However, its lifetime is longer, because its reflective portion degrades less than organic layers.

Figure 3:
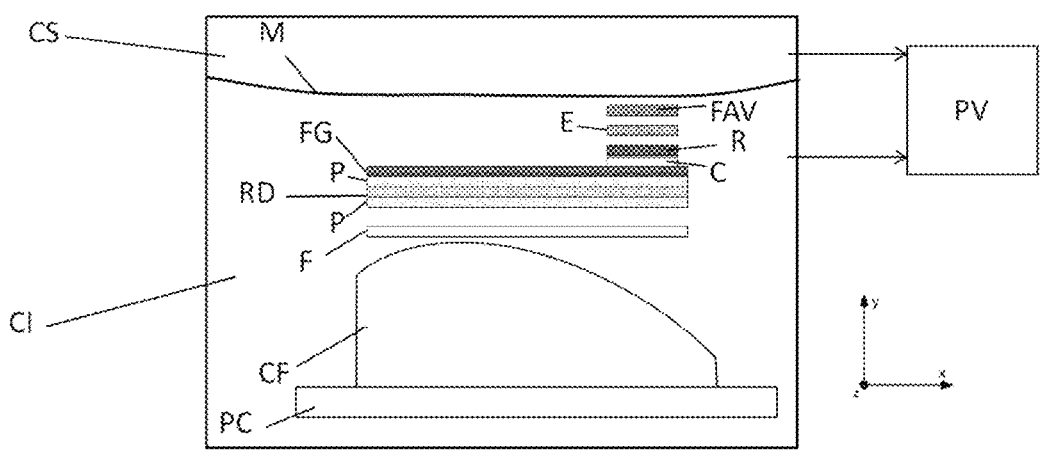
FIG. 3, an illustration of a method for manufacturing a concentrating photovoltaic sub-module according to one embodiment of the invention.

FIG. 3 shows an illustration of a method for manufacturing a concentrating photovoltaic sub-module according to one embodiment of the invention. A layer C of adhesive or of encapsulant and a layer FG of a material of good thermal conductivity, called the dissipative layer, are added between the structural element and the photovoltaic receiver R. The dissipative layer FG is placed on the surface of the structural element and the layer C of adhesive or of encapsulant allows the receiver R to be held in place on the dissipative layer FG. The material from which the dissipative layer FG is made has a thermal conductivity higher than that of the material from which the structural element is made, in order to be able to effectively dissipate heat along the sub-module, and in particular level with the photovoltaic receiver R. Advantageously, this material has a thermal conductivity close to that of aluminum, i.e. higher than 100 W/(m·K), and a low density so as to achieve a lightweight sub-module capable of dissipating heat as effectively as a sub-module comprising an aluminum mirror. This material may, for example, be graphite. Specifically, the density of graphite is 1.35 g/cm$^3$ and its thermal conductivity is 140 W/(m·K) in the directions x and y and 8 W/(m·K) in the direction z, whereas aluminum has a thermal conductivity of 237 W/(m·K) and a density of 2.7 g/cm$^3$.

According to another embodiment of the invention, the transparent layer FAV and the encapsulant E may cover the entire surface of the dissipative layer in order to protect it. The dissipative layer FG may cover the entire surface of the structural element or only some. In the latter case, the dissipative layer FG has a thickness larger than the case where it covers the entire surface of the structural element. Nevertheless, it covers at least the area of the structural element under the photovoltaic receiver R, because it is important to be able to dissipate the heat accumulated in the receiver R, to avoid a decrease in the efficiency of the receiver R and to increase its lifetime.

According to one embodiment, the material of good thermal conductivity from which the dissipative layer FG is made is graphite or graphene. More particularly, it is made of graphite with a thickness comprised between 50 μm and 500 μm, in order to ensure a good dissipation of heat, while remaining supple and lightweight.

The sub-module comprising the dissipative layer FG and the layer C of adhesive or of encapsulant is assembled during a hot lamination, preferably under vacuum, with forming using the counter-mold CF.

As indicated above, the counter-mold CF allows the concave parabolic shape of the reflective face of the sub-module to be defined in the laminating step, and the hot-lamination program is optimized with respect to temperature, pressure and length depending on the materials used.

According to another embodiment of the invention, the layer C of encapsulant or of adhesive is made of the EVA, polyolefin, silicone, thermoplastic polyurethane, polyvinyl butyral, functional polyolefin or of ionomer. Generally, the same material is used for the layer C of adhesive or of encapsulant and for the encapsulant E.

The choice of the materials from which the sub-modules are made depends on the weight of the targeted sub-module, though they must allow a parabolic shape, which ensures a good concentration, to be obtained, allow conditions due to the environment (earth, stratosphere or space) of the module to be met, and allow the desired dissipation of heat to be achieved.

The choice of the materials from which the sub-modules are made depends on the weight of the targeted sub-module, though they must allow a parabolic shape, which ensures a good concentration, to be obtained, allow conditions due to the environment (earth, stratosphere or space) of the module to be met, and allow the desired dissipation of heat to be achieved. Thus, using a carbon/epoxy prepreg, of weight per unit area comprised between 80 g/m$^2$ and 300 g/m$^2$, associated with an aluminum honeycomb of a thickness of 3 mm for the structural element, it is possible to produce a stiff sub-module, without a dissipative layer, of a low weight, much smaller than that of a conventional module (difference of 30%). If a dissipative graphite layer is added, the weight of the sub-module will then be the same as that of a conventional module, but it will, nevertheless, remain stiffer than a conventional sub-module.

The following is an example of implementation of the manufacture of a photovoltaic sub-module according to one of the embodiments of the invention:

The transparent layer FAV is made of HALAR (ECTFE) or of FEP with a thickness of 25 μm and a weight per unit area of 54 g/m$^2$;

The transparent encapsulant E and the layer C of adhesive or of encapsulant are made of ionomer with a thickness of 50 μm and a weight per unit area of 45 g/m$^2$;

The photovoltaic receiver R consists of triple-junction solar cells of 10 mm width and of 10 mm length and of an IMS-PCB receiver of 75 μm thickness;

The dissipative layer FG is a graphite sheet with a thickness of 130 μm;

The core RD is a honeycomb core made of aluminum of 3 mm thickness and of 78 g/m$^2$ weight per unit area, flanked by two skins P made of carbon/epoxy prepreg of 110 g/m$^2$ weight per unit area;

The reflective film F consists of a reflective film made of PET, of an aluminum-containing deposition and of a protective varnish, the film F having a thickness of 71 μm and a weight per unit area of 105 g/m$^2$.

The assembly undergoes a lamination on a counter-mold CF, the lamination and the counter-mold having the same features as the example described above of implementation of manufacture of a photovoltaic sub-module comprising no dissipative layer FG.

Figure 4:
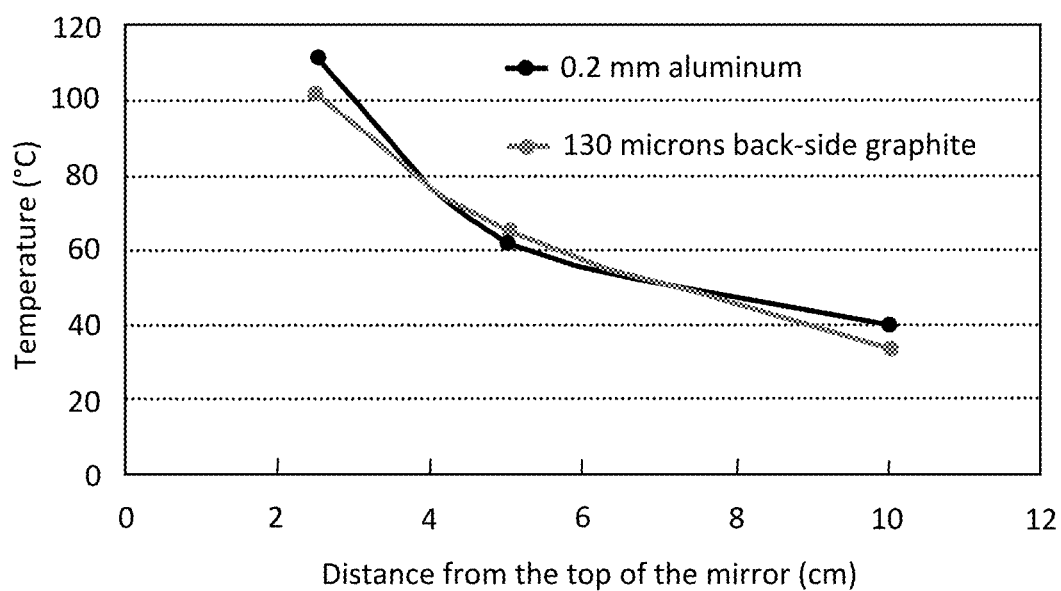
FIG. 4, a graph of the temperature along a concentrating photovoltaic sub-module in operation according to one embodiment of the invention.

FIG. 4 compares the temperature along two concentrating photovoltaic sub-modules in operation depending on the distance from the top of the mirror. On the x-axis, the distance 2.5 cm corresponds to the location of the focal point and therefore of the photovoltaic receiver R on the two sub-modules. A photovoltaic module comprising a graphite sheet of 130 μm, produced according to the above example of manufacture, thus dissipates heat almost identically to a sub-module the structural element of which is a mirror made of aluminum of 0.2 mm thickness comprising no graphite sheet.

Figure 5:
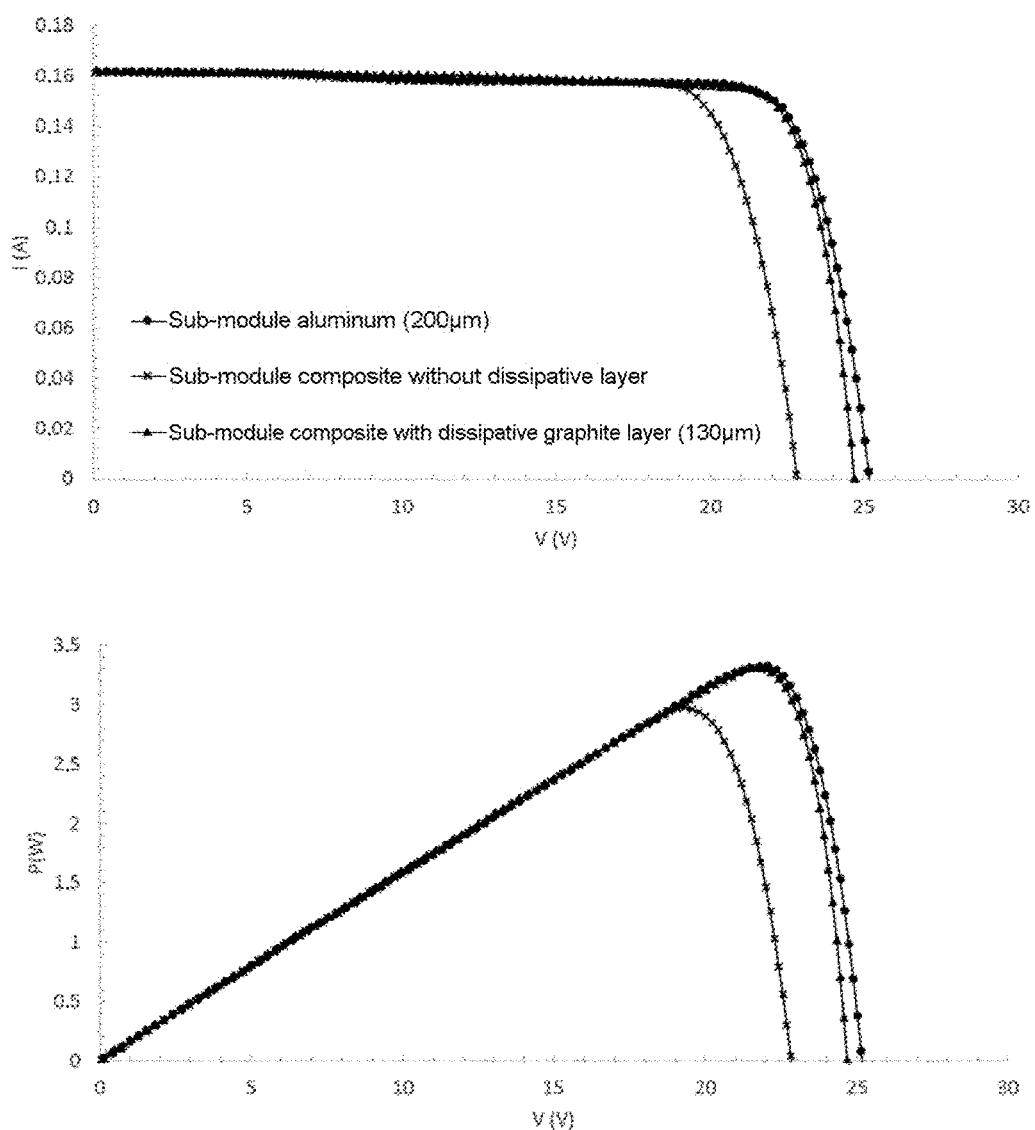
FIG. 5, a graph of the current and power of three concentrating photovoltaic sub-modules as a function of their voltage.

FIG. 5 compares the current and power values of three sub-modules depending on their voltage, for an exterior illumination of 735 W/m$^2$. The three sub-modules compared are a sub-module the structural element of which is a mirror made of aluminum of 200 μm thickness and two sub-modules the structural element of which comprises a core flanked by two skins, one of the two sub-modules in addition comprising a dissipative graphite layer of 130 μm thickness. The continuous illumination, of 735 W/m$^2$, of the studied sub-modules causes a temperature increase the magnitude of which depends on the materials used. However, a temperature increase leads directly to a drop in voltage and therefore to a lowering of the maximum power point. A sub-module comprising a core flanked by two skins, without a dissipative layer, then sees a drop in power of 10%, compared to a sub-module comprising a mirror made of aluminum. The addition of a dissipative graphite layer to the entire surface of the structural element allows this effect to be corrected, and an efficiency that is equivalent and a mechanical strength that is much higher than those of the sub-module comprising an aluminum mirror to be obtained.

The invention claimed is:

1. A method for manufacturing a concentrating photovoltaic solar sub-module equipped with a reflective first face having a concave predefined geometric shape, comprising laminating, in a single step, a multi-layer assembly comprising in succession:

a structural element equipped with the reflective first face and a second face, opposite the first;

a layer of a material of good thermal conductivity, higher than that of the material from which the structural element is composed, said layer being placed on the second face of the structural element;

a layer of encapsulant or a layer of adhesive;

a photovoltaic receiver, the layer of encapsulant or the layer of adhesive being placed between the layer of the material of good thermal conductivity and the photovoltaic receiver;

a layer made of transparent encapsulating material, covering at least an entire surface of the photovoltaic receiver; and a transparent protective layer covering the layer made of transparent encapsulating material, wherein the layer of encapsulant or the layer of adhesive and the layer of transparent encapsulating material are distinct layers; and during lamination, the reflective first face of the structural element is shaped by being brought into contact with a convex surface of a counter-mold, in order to obtain the reflective first face having the concave predefined geometric shape, wherein during lamination, a uniform vertical load is gradually applied to a top of the counter-mold applying a progressive pressure up to a plateau of 1000 mbar.

2. The method for manufacturing the concentrating photovoltaic solar sub-module as claimed in claim 1, wherein the concave predefined geometric shape of said reflective face is parabolic.

3. The method for manufacturing the concentrating photovoltaic solar sub-module as claimed in claim 1, wherein said structural element is made of composite.

4. The method for manufacturing the concentrating photovoltaic solar sub-module as claimed in claim 1, wherein said material of good thermal conductivity is graphite.

5. The method for manufacturing the concentrating photovoltaic solar sub-module as claimed in claim 4, wherein said material of good thermal conductivity has a thickness comprised between 50 µm and 500 µm.

6. The method for manufacturing the concentrating photovoltaic solar sub-module as claimed in claim 1 wherein said material of good thermal conductivity is graphene.

7. The method for manufacturing the concentrating photovoltaic solar sub-module as claimed in claim 1, wherein said transparent encapsulating material and said transparent protective layer cover an entire surface of said material of good thermal conductivity, so as to protect it.

8. The method for manufacturing the concentrating photovoltaic sub-module as claimed in claim 1, wherein said material of good thermal conductivity covers the entire surface of the second face of the structural element.

* * * * *